(12) United States Patent
Knighten et al.

(10) Patent No.: US 7,456,364 B2
(45) Date of Patent: Nov. 25, 2008

(54) USING A THRU-HOLE VIA TO IMPROVE CIRCUIT DENSITY IN A PCB

(75) Inventors: James Knighten, Poway, CA (US); Jun Fan, San Marcos, CA (US); Norman Smith, San Marcos, CA (US)

(73) Assignee: Teradata US, Inc., Miamisburg, OH (US)

( * ) Notice: Subject to any disclaimer, the term of this patent is extended or adjusted under 35 U.S.C. 154(b) by 0 days.

(21) Appl. No.: 11/563,729

(22) Filed: Nov. 28, 2006

(65) Prior Publication Data

US 2007/0138617 A1    Jun. 21, 2007

Related U.S. Application Data

(60) Provisional application No. 60/752,448, filed on Dec. 21, 2005.

(51) Int. Cl.
*H01R 12/04*    (2006.01)
*H05K 1/00*    (2006.01)

(52) U.S. Cl. .................. 174/265; 174/260; 174/262; 361/778

(58) Field of Classification Search ............... 174/265, 174/266, 263, 260, 262; 361/788
See application file for complete search history.

(56) References Cited

U.S. PATENT DOCUMENTS

| | | | |
|---|---|---|---|
| 6,388,208 B1 * | 5/2002 | Kiani et al. ............... 174/266 |
| 6,555,761 B2 * | 4/2003 | Amir ......................... 174/263 |
| 6,747,217 B1 * | 6/2004 | Jochym et al. ............ 174/265 |
| 2005/0224912 A1 * | 10/2005 | Rogers et al. ............. 257/532 |

* cited by examiner

*Primary Examiner*—Dean A. Reichard
*Assistant Examiner*—Andargie M Aychillhum
(74) *Attorney, Agent, or Firm*—John D. Cowart

(57) ABSTRACT

A printed circuit board includes multiple layers on which electrically conductive traces reside, where at least two of the electrically conductive traces each has a first portion formed on one layer of the printed circuit board and a second portion formed on another layer of the printed circuit board. The printed circuit board also includes a thru-hole via that includes at least two electrically conductive portions electrically isolated from each other, such that each of the electrically conductive portions connects electrically to both the first and second portions of a corresponding one of the electrically conductive traces.

5 Claims, 3 Drawing Sheets

US 7,456,364 B2

USING A THRU-HOLE VIA TO IMPROVE CIRCUIT DENSITY IN A PCB

CROSS-REFERENCE TO RELATED APPLICATION

This application claims priority from U.S. Provisional Application 60/752,448, filed on Dec. 21, 2005, by James L. Knighten, Jun Fan, and Norman W. Smith. This application is related to, and incorporates by reference, U.S. application Ser. No. 11/563,820, titled "Passing Multiple Conductive Traces Through a Thru-Hole Via in a PCB," and filed on Nov. 28, 2006 by Jun Fan, Arthur R. Alexander, James L. Knighten, Norman W. Smith, and Joseph R. Fleming (NCR matter 12226); and to U.S. application Ser. No. 11/563,972, titled "Crossing Conductive Traces in a PCB," and filed on Nov. 28, 2006 by James L. Knighten, Norman W. Smith and Jun Fan (NCR matter 12366).

BACKGROUND

One of the largest challenges that the electronics industry persistently faces is the ability to achieve the ever-higher levels of packaging density required to meet the ever-increasing demands for feature-rich design and very small packaging. In this environment, any design approach that increases packaging density is a valuable tool in the design arsenal.

SUMMARY

Described below is a printed circuit board that includes multiple layers on which electrically conductive traces reside, where at least two of the electrically conductive traces each has a first portion formed on one layer of the printed circuit board and a second portion formed on another layer of the printed circuit board. The printed circuit board also includes a thru-hole via that includes at least two electrically conductive portions electrically isolated from each other, such that each of the electrically conductive portions connects electrically to both the first and second portions of a corresponding one of the electrically conductive traces.

In some cases, the electrically conductive traces run in directions that are parallel to each other, and in other cases, the electrically conductive traces run in directions that intersect (e.g., are perpendicular to) each other. When the electrically conductive traces run in directions that intersect each other, the first and second portions of at least one of the electrically conductive traces are often co-linear with each other, while the first and second portions of another of the electrically conductive traces are not co-linear with each other.

In some cases, the electrically conductive traces are positioned to reside in separate circuits in the printed circuit board. Also, the printed circuit board often has multiple layers, and the first and second portions of each of the electrically conductive traces often lie on separate layers.

Also described is a printed circuit board that includes at least two mounting pads formed on a surface for mounting a circuit component, such as array of pads formed for mounting a ball grid array (BGA) package. The printed circuit board also includes a thru-hole via that includes at least two electrically conductive portions that are electrically isolated from each other, where each of the electrically conductive portions of the thru-hole via connects electrically to at least one of the mounting pads in the array.

In some cases, each of the electrically conductive portions of the thru-hole via connects at least one of the mounting pads to a layer of the printed circuit board other than the layer on which the mounting pads are formed. Also, the thru-hole via is often positioned physically between two of the mounting pads.

Other features and advantages will become apparent from the description and claims that follow.

DETAILED DESCRIPTION

Figure 1:
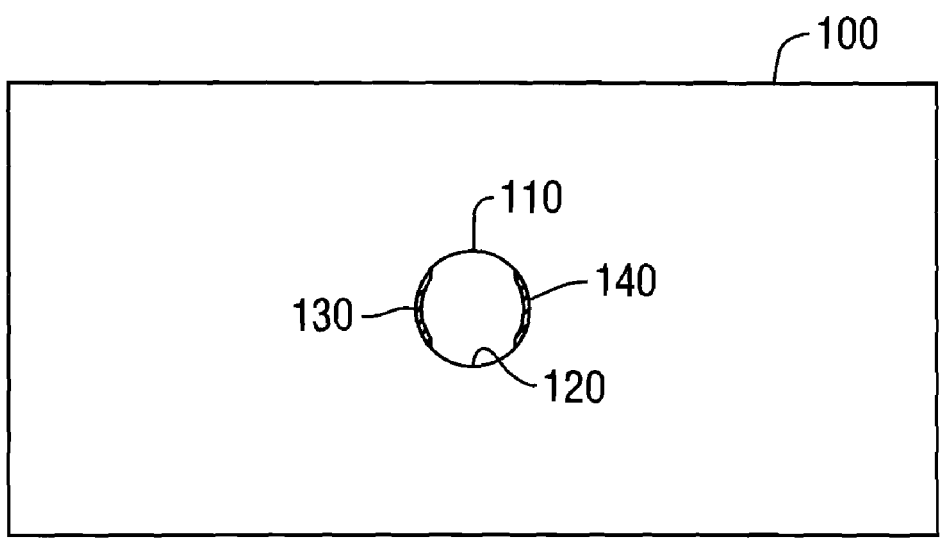
FIG. 1 is diagram showing a printed circuit board (PCB) with a thru-hole via through which multiple electrically conductive traces pass.

FIG. 1 shows a multi-layer printed circuit board (PCB) 100 having a thru-hole via 110 that is constructed to allow multiple conductive traces to pass from one layer of the PCB to another layer of the PCB. A thru-hole via or plated through hole, as the term is commonly understood in the art of PCB manufacturing, is a hole formed through the layers of a printed circuit board and then coated (or "plated") with an electrically conductive material (typically a metal such as copper) to allow an electrical signal in the PCB to move from one layer to another and/or to allow a conductive pin on an electronic component to connect to a reference plane or a signal trace in the PCB. In a traditional thru-hole via, the conductive coating covers the entire surface of the via, thus allowing only a single conductive trace to pass through the via or a single electronic component to connect to the via.

The thru-hole via 110 of FIG. 1 is constructed so that its internal surface 120 includes multiple conductive portions 130, 140 that are separated physically by gaps. This ensures that the conductive portions 130, 140 are electrically isolated—i.e, that no electrically conductive path exists between the conductive portions 130, 140 when the PCB is fabricated and has not yet been populated with electronic components. A process for fabricating such a thru-hole via 110 in a PCB is described in detail in the U.S. application incorporated by reference above.

Figure 2:
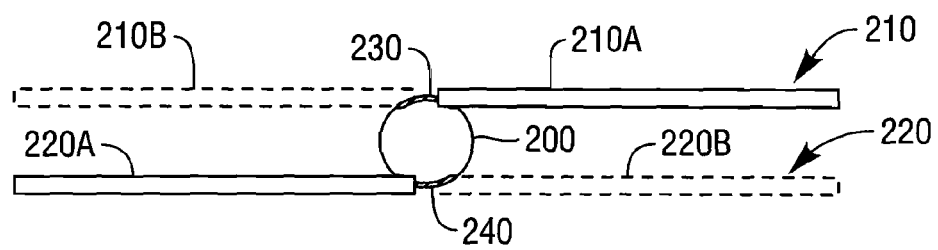
FIG. 2 is a diagram showing a thru-hole via through which currents from separate circuits pass.

FIG. 2 shows a thru-hole via 200 through which conductive traces 210, 220 from two separate circuits pass in transitioning from one layer of a multi-layer PCB to another layer. The conductive traces 210, 220, in residing in two separate circuits, are electrically isolated from each other when the PCB is fabricated and before it is populated with electronic components.

The thru-hole via 200 has a construction like that shown in FIG. 1, with two electrically isolated, electrically conductive portions 230, 240 formed on its inner surface. In the example shown here, each of the conductive traces 210, 220 has a first conductive portion 210A, 220A (shown in solid lines) lying on a first layer of the PCB and a second conductive portion 210B, 220B (shown in dashed lines) lying on a second layer of the PCB.

The portion 210A, 220A of each conductive trace 210, 220 that carries current on the first layer of the PCB intersects the thru-hole via 200 and makes electrical contact with a corresponding one of the electrically conductive portions 230, 240 of the thru-hole via 200. The current flowing through the conductive traces 210, 220 then passes through the electrically conductive portions 230, 240 of the thru-hole via 200 to the portions 210B, 220B of the electrically conductive traces 210, 220 that lie on the second layer of the PCB.

The result of this construction is an improvement in PCB circuit density. Because a single thru-hole via is used to pass currents from multiple separate circuits, fewer via pads and anti-pads are needed on the PCB than are required by traditional PCB fabrication techniques, thus conserving PCB real estate and allowing the placement of a greater number of circuit components on the PCB.

Figure 3:
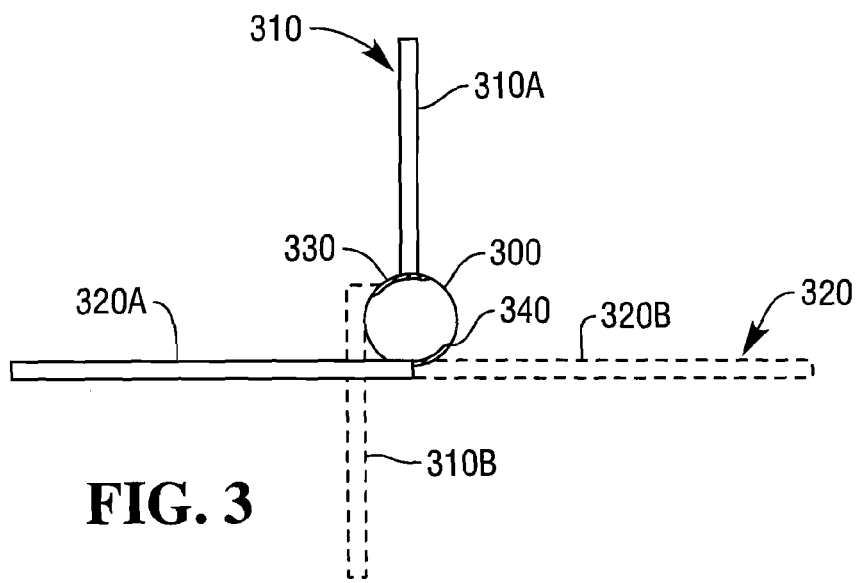
FIG. 3 is a diagram showing a thru-hole via through which currents from separate circuits pass on conductive traces that run in intersecting directions.

FIG. 3 shows another thru-hole via 300 through which conductive traces 310, 320 from two separate circuits pass in transitioning from one layer of a multi-layer PCB to another layer. As shown here, the conductive traces 310, 320 run in directions that intersect each other and which, in fact, are perpendicular to each other in this example.

As with the conductive traces of FIG. 2, each of the conductive traces 310, 320 shown here has a first conductive portion 310A, 320A (shown in solid lines) lying on a first layer of the PCB and a second conductive portion 310B, 320B (shown in dashed lines) lying on a second layer of the PCB. The portion 310A, 320A of each conductive trace 310, 320 that carries current on the first layer of the PCB intersects the thru-hole via 300 and makes electrical contact with a corresponding electrically conductive portion 330, 340 of the thru-hole via 300. The currents flowing through the conductive traces 310, 320 then pass through the electrically conductive portions 330, 340 of the thru-hole via 300 to the portions 310B, 320B of the electrically conductive traces 310, 320 that lie on the second layer of the PCB.

In the example of FIG. 3, because the conductive traces 310, 320 run perpendicular to each other, one of the conductive portions 310B of at least one of the conductive traces 310, on intersecting the corresponding electrically conductive portion 330 of the thru-hole via 300, is routed especially to avoid intersecting the electrically conductive portion 340 of the thru-hole via 300 that carries current from the other conductive trace 320. The result, as shown, here, is that the conductive portions 320A, 320B of one of the conductive traces 320 are co-linear, while the conductive portions 310A, 310B of the other conductive trace 310 are not.

Figure 4:
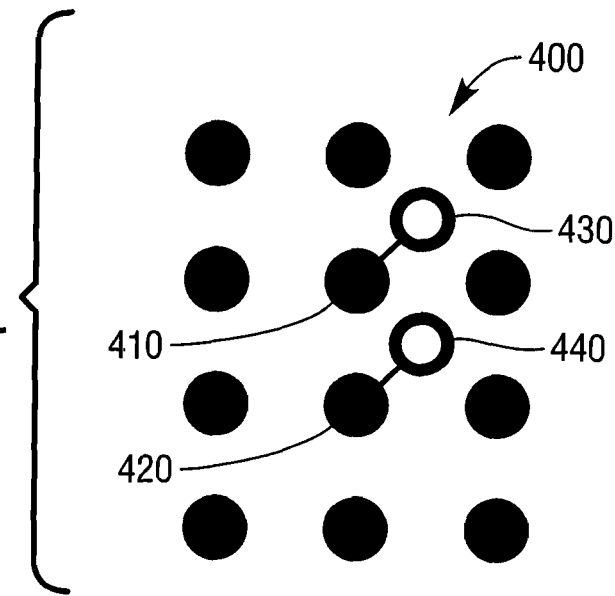
FIG. 4 is a diagram showing a traditional conductive mounting-pad footprint for a ball grid array (BGA) package.
Figure 5:
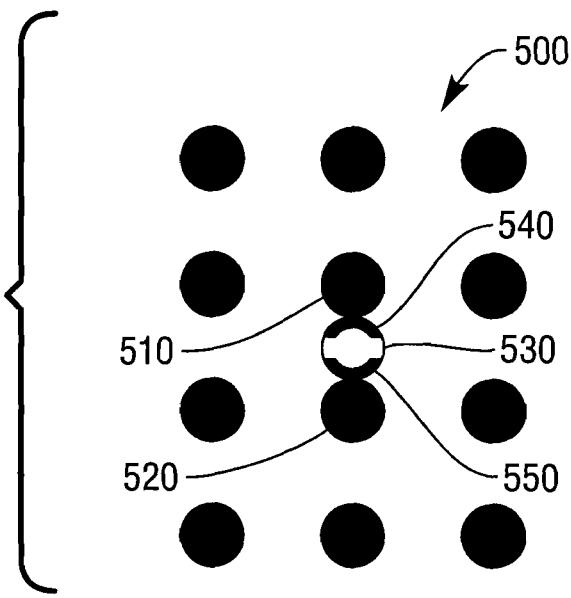
FIG. 5 is a diagram showing an alternative conductive mounting-pad footprint for a BGA package.

FIGS. 4 and 5 together show another use for a thru-hole via that is constructed to improve circuit density on a PCB. FIG. 4 shows a mounting-pad configuration 400 for a ball grid array (BGA) package using traditional PCB fabrication techniques. In this configuration 400, the two mounting pads 410, 420 lying at the center of the array must connect to one or more inner layers of the PCB. To make this connection to the PCB's inner layers, two thru-hole vias 430, 440 are drilled in the PCB and plated with an electrically conductive material, such as copper. The result is that the pins of the BGA that contact the two mounting pads 410, 420 at the center of the array are connected electrically to the inner layers of the PCB by the thru-hole vias 430, 440.

FIG. 5 shows a mounting-pad configuration 500 for a BGA package that reduces the amount of PCB real estate consumed by the BGA package and thus allows for the inclusion of additional circuit components that are not possible using traditional PCB fabrication techniques. In this example, the two mounting pads 510, 520 lying at the center of the array connect electrically to a single thru-hole via 530. Like the thru-hole vias described above, the thru-hole via 510 shown here includes two electrically isolated, electrically conductive portions 540, 550 that extend through the thru-hole via 530. Each of these electrically conductive portions 540, 550 of the thru-hole via 530 connects electrically to one of the mounting pads 510, 520 at the center of the array and, in turn, connects the mounting pad to one or more of the inner layers of the PCB.

The text above describes one or more specific embodiments of a broader invention. The invention also is carried out in a variety of alternative embodiments and thus is not limited to those described here. Many other embodiments are also within the scope of the following claims.

We claim:

1. A printed circuit board comprising:
   multiple layers on which electrically conductive traces reside, where at least two of the electrically conductive traces each has a first portion formed on one layer of the printed circuit board and a second portion formed on another layer of the printed circuit board; and
   a thru-hole via that includes at least two electrically conductive portions electrically isolated from each other, such that each of the electrically conductive portions connects electrically to both the first and second portions of a corresponding one of the electrically conductive traces;
   where at least one of the layers of the circuit board contacts at least two of the electrically conductive portions of the thru-hole via.

2. The printed circuit board of claim 1, where the electrically conductive traces run in directions that are parallel to each other.

3. The printed circuit board of claim 1, where the electrically conductive traces run in directions that are perpendicular to each other, and where the first and second portions of at least one of the electrically conductive traces are co-linear with each other.

4. The printed circuit board of claim 1, where the electrically conductive traces run in directions that are perpendicular to each other, and where the first and second portions of at least one of the electrically conductive traces are not co-linear with each other.

5. The printed circuit board of claim 1, where the electrically conductive traces are positioned to reside in separate circuits in the printed circuit board.

\* \* \* \* \*